(12) United States Patent
Chen et al.

(10) Patent No.: US 11,854,841 B2
(45) Date of Patent: Dec. 26, 2023

(54) SPACE FILLING DEVICE FOR WET BENCH

(71) Applicant: Taiwan Semiconductor Manufacturing Co., Ltd., Hsinchu (TW)

(72) Inventors: Yen-Ji Chen, Hsinchu (TW);
Chih-Shen Yang, Hsinchu (TW);
Cheng-Yi Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/873,054

(22) Filed: Jul. 25, 2022

(65) Prior Publication Data

US 2022/0359236 A1    Nov. 10, 2022

Related U.S. Application Data

(62) Division of application No. 16/430,329, filed on Jun. 3, 2019, now Pat. No. 11,482,430.

(60) Provisional application No. 62/772,423, filed on Nov. 28, 2018.

(51) Int. Cl.
*H01L 21/67* (2006.01)
*B08B 9/08* (2006.01)
*H01L 21/02* (2006.01)
*H01L 21/687* (2006.01)
*B08B 3/08* (2006.01)

(52) U.S. Cl.
CPC ......... *H01L 21/67057* (2013.01); *B08B 9/08* (2013.01); *H01L 21/02057* (2013.01); *H01L 21/67023* (2013.01); *H01L 21/68707* (2013.01); *B08B 3/08* (2013.01)

(58) Field of Classification Search
CPC ......... H01L 21/67057; H01L 21/02057; H01L 21/67023; H01L 21/68707; B08B 3/08; B08B 9/08
USPC ....................................... 134/22.1
See application file for complete search history.

(56) References Cited

U.S. PATENT DOCUMENTS

| 5,668,452 | A | 9/1997 | Villarreal et al. |
| 6,036,031 | A | 3/2000 | Ishikawa |
| 2002/0061647 | A1* | 5/2002 | Kawamoto ....... H01L 21/02052 257/E21.228 |
| 2003/0230384 | A1* | 12/2003 | Su ..................... H01L 21/67781 156/345.22 |
| 2011/0210450 | A1 | 9/2011 | Theuss et al. |
| 2013/0048034 | A1 | 2/2013 | Maegawa |

(Continued)

FOREIGN PATENT DOCUMENTS

| CN | 102157364 A | 8/2011 |
| TW | 497166 B | 8/2002 |
| TW | I406328 B1 | 8/2013 |

(Continued)

*Primary Examiner* — Tinsae B Ayalew
(74) *Attorney, Agent, or Firm* — Seed IP Law Group LLP

(57) ABSTRACT

The disclosed techniques include a space filling device to be used with a wet bench in chemical replacement procedures. The space filling device has an overall density that is higher than the chemicals used to purge the wet bench. As such, when embedded into the wet bench, or more specifically, the chemical tank of the wet bench, the space filling device will occupy a portion of the interior volume space. As a result, less purging chemicals are used to fill and bath the wet bench.

20 Claims, 12 Drawing Sheets

(56) References Cited

U.S. PATENT DOCUMENTS

2017/0030632 A1    2/2017   Kranovich

FOREIGN PATENT DOCUMENTS

| TW | 201705196 A | 2/2017 |
| TW | 201839889 A | 11/2018 |

* cited by examiner

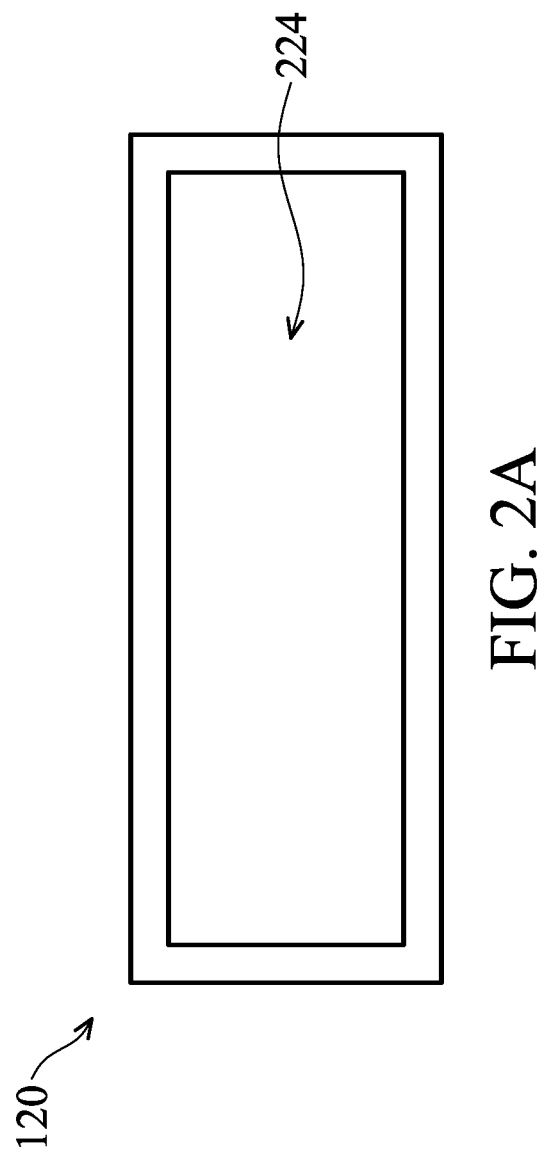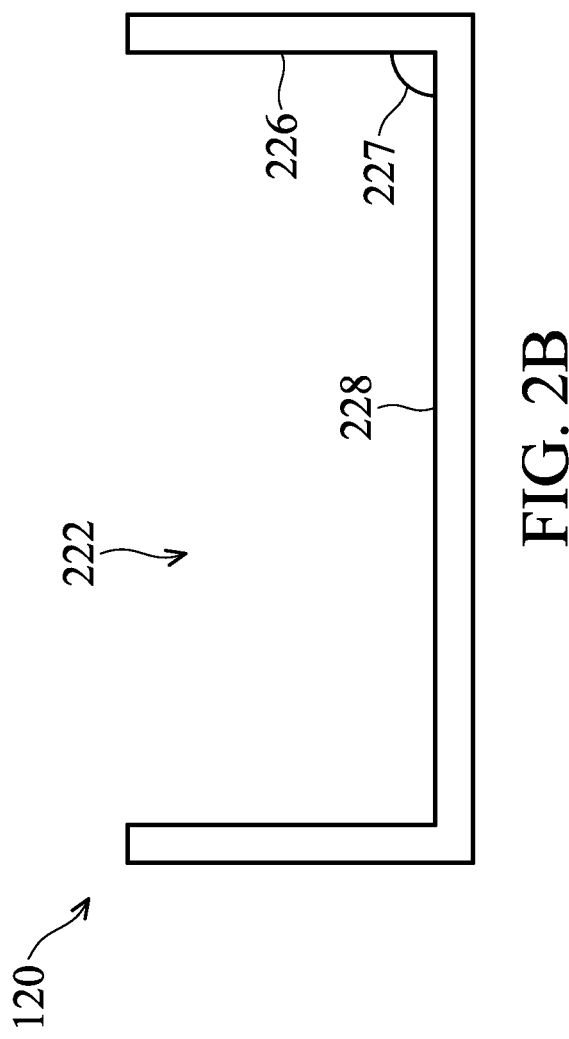

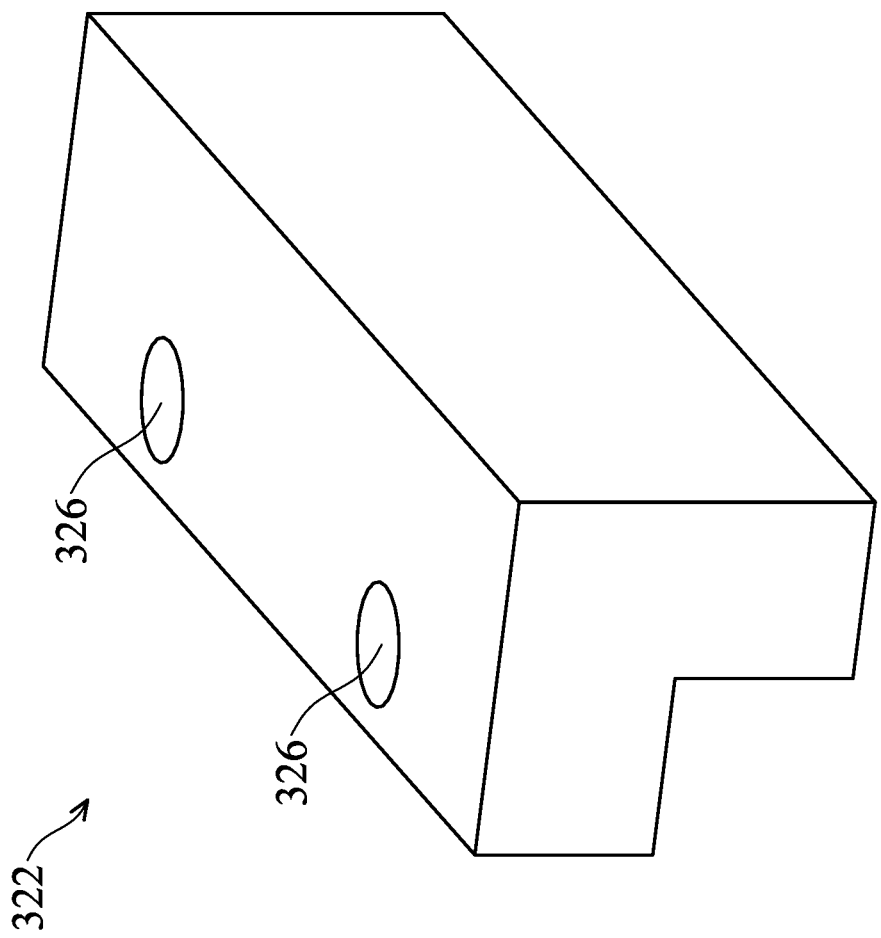

SPACE FILLING DEVICE FOR WET BENCH

CROSS-REFERENCE TO RELATED APPLICATION(S)

This application is a divisional application of U.S. application Ser. No. 16/430,329, filed Jun. 3, 2019, which claims the benefit and priority to U.S. Provisional Application No. 62/772,423, filed Nov. 28, 2018, the entirety of which are hereby incorporated by reference.

BACKGROUND

In semiconductor fabrication, the process of manufacturing semiconductor devices involves a wide variety of steps including a layer formation process for forming multiple layers such as a polycrystalline layer, an oxide layer, a nitride layer, and a metal layer on a wafer as a semiconductor substrate. These steps generally also include a diffusion process, a photolithography process, an etching process, a cleaning process, an ion implantation process, and the like, which are carried out between the steps of layer formation.

In a wet selective etching process, the substrate is etched through exposure to a liquid etchant. The liquid etchant removes a predetermined amount of the uncovered or unreacted material and, thereby, forms patterns in the substrate. Two basic wet etching techniques are spray etching and immersion etching. In immersion etching, a wafer is immersed in a liquid etchant contained in a wet bench set-up. An immersion etching process may use liquid chemical solutions like potassium hydroxide (KOH), tetramethylammonium hydroxide (TMAH), HF, $HNO_3$, or other suitable chemical solutions.

A wet-bench set-up or "wet bench" includes one or more tanks which contain the respective cleaning solutions and are positioned in a bench-like structure. Batches of wafers are moved in sequence through the tanks, typically by operation of a computer-controlled automated apparatus referred to as a wafer transfer robot.

Wet benches are also used for containing liquid chemical solutions in wafer cleaning. For example, the generally referred to RCA processes are used to clean a wafer. The RCA processes may include a general cleaning process using one or more of a sulfuric acid solution or a hydrogen peroxide solution; a particle removal process using one or more of deionized water (DI water), ammonium hydroxide, or hydrogen peroxide; an oxide removal process using one or more of hydrogen fluoride (HF) or DI water; or a metal contamination removal process using one or more of DI water, hydrogen peroxide, or hydrochloric acid.

The chemicals in a wet bench may need to be replaced regularly as contaminants accumulate in the use of the chemicals. In each chemical replacement procedure, the wet bench is cleaned multiple times by chemical purging, which is costly.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIGS. 2A and 2B show an inner tank of the wet bench set-up of the system of FIG. 1;

FIGS. 3A, 3B and 3C show views of the space filling device;

DETAILED DESCRIPTION

Figure 1:
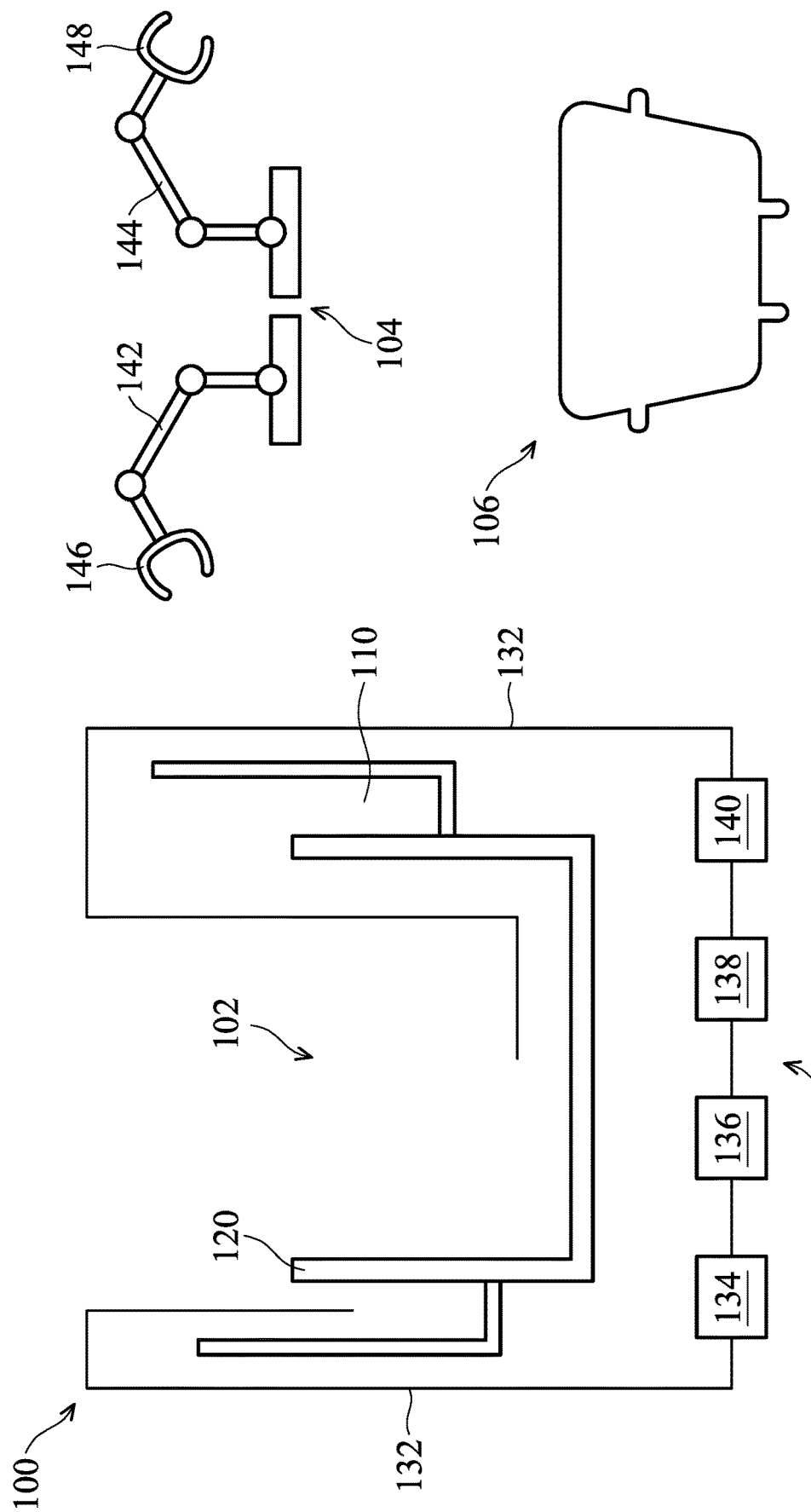
FIG. 1 shows a system including a wet bench set-up, a transfer robot and a space filling device.

The disclosed techniques include a space filling device to be used with a wet bench in the chemical replacement procedures. The space filling device has an overall density that is higher than the chemicals used to purge the wet bench. As such, when embedded into the wet bench, or more specifically, the chemical tank of the wet bench, the space filling device will occupy a portion of the interior volume space. As a result, less purging chemicals are used to fill and bath the wet bench.

The space filling device may be seated onto the interior bottom surface of the chemical tank of the wet bench or may be hung within the interior space of the chemical tank. The space filling device includes protrusion elements on the sidewall and/or the exterior bottom surface thereof to reduce the physical contact with the chemical tank. The space filling device may also include handles on the sidewall or the top portion thereof to facilitate handling of the space filling device by a transfer robot. In an embodiment, a handle on the sidewall and a sidewall protrusion element may be integrated into a same physical element.

The surface material of the space filling device may be selected based on the chemical solutions used in the respective wet bench. Generally, the surface materials of the space filling device may be Teflon, PEEK, stainless steel or quartz.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 is a cleaning system 100. The cleaning system 100 includes a wet-processing bench set-up 102, one or more transfer robots 104 and a space filling device 106. Shown as a side cross-sectional view, an embodiment of the wet bench set-up 102 comprises an outer basin 110, an inner tank 120, and chemical circulation components 130. The outer basin 110 at least partially surrounds the inner tank 120 and functions to capture chemicals that overflow from the inner tank 120. The outer basin 110 may also capture gases or particles that are generated in a cleaning process.

The inner tank 120 functions to hold cleaning chemicals in the form of gases or liquid solutions and hold the wafers or other objects to be cleaned during the cleaning process. For example, one transfer robot 104, e.g., a wafer transfer robot 142, may hold one or more semiconductor wafers and immerse the semiconductor wafers into the inner tank 120. The inner tank 120 has fluidic communication with the outer basin 110. The outer basin 110 and the inner tank 120 include an inner surface material that is compatible with or sustains the cleaning processes and cleaning chemicals. For example, the internal surface material includes acid-resistant polypropylene, e.g., polyvinyl difluoride (PVDF), solvent-friendly stainless steel, or any other chemical-resistive materials.

FIG. 2 schematically shows top plane view (FIG. 2A) and side cross-sectional view (FIG. 2B) of the inner tank 120. The inner tank 120 includes an interior space 222. The interior space 222 may be cylindrical, cubic, a hexagonal prism, pyramidal, or other suitable shapes. Specifically, while shown as rectangular for illustration, the upper opening 224 of the interior space 222 may be a circle, an ellipse, an oval, a square, a hexagon, or other polygonal shapes from the top plane view of FIG. 2A. While shown as rectangular for illustration, a sidewall 226 of the interior space 222 may be a square, trapezoid, triangle or other suitable shapes from the side cross-sectional view of FIG. 2B. Specifically, the sidewall 226 may be substantially perpendicular, i.e., an angle 227 of 90 degree, with respect to a bottom surface 228 (as shown in FIG. 2B) or may form an acute angle 227 (i.e., smaller than 90 degree) or an obtuse angle 227 (i.e., larger than 90 degree) with respect to the bottom surface 228.

Referring back to FIG. 1, the chemical circulation components 130 includes also chemical supply/return lines 132, for delivering cleaning chemicals to/from the inner tank 120 or the outer basin 110. In an embodiment, the cleaning chemicals are delivered to the inner tank 120 and are returned from both the inner tank 120 and the outer basin 110 for recycling and reuse. In an embodiment, the chemical supply/return lines 132 couple an in-line heater 134, a filter 136, a damper 138 and a pump 140 to one or more of the inner tank 120 or the outer basin 110. The functions of the heater 134, the filter 136, the damper 138 and the pump 140 are appreciable by artisans in the art, the descriptions of which are omitted for simplicity purposes.

The transfer robots 104 may include the wafer transfer robot 142 that is configured to hold a wafer, e.g., in a wafer cassette of the transfer robot 104, and immerse the wafer into the inner tank 120 for cleaning the wafer. The transfer robots 104 may also include an object transfer robot 144 that is configured to hold an object and immerse or dispose the object into the inner tank 120. For example, the object transfer robot 144 is configured to hold and transport the space filling device 106. In an embodiment, the wafer transfer robot 142 and the object transfer robot 144 are a same robot device that includes a same or different end effector 146, 148, e.g., grippers, to hold the wafer cassette or the space filling device 106, respectively.

Figure 3A:
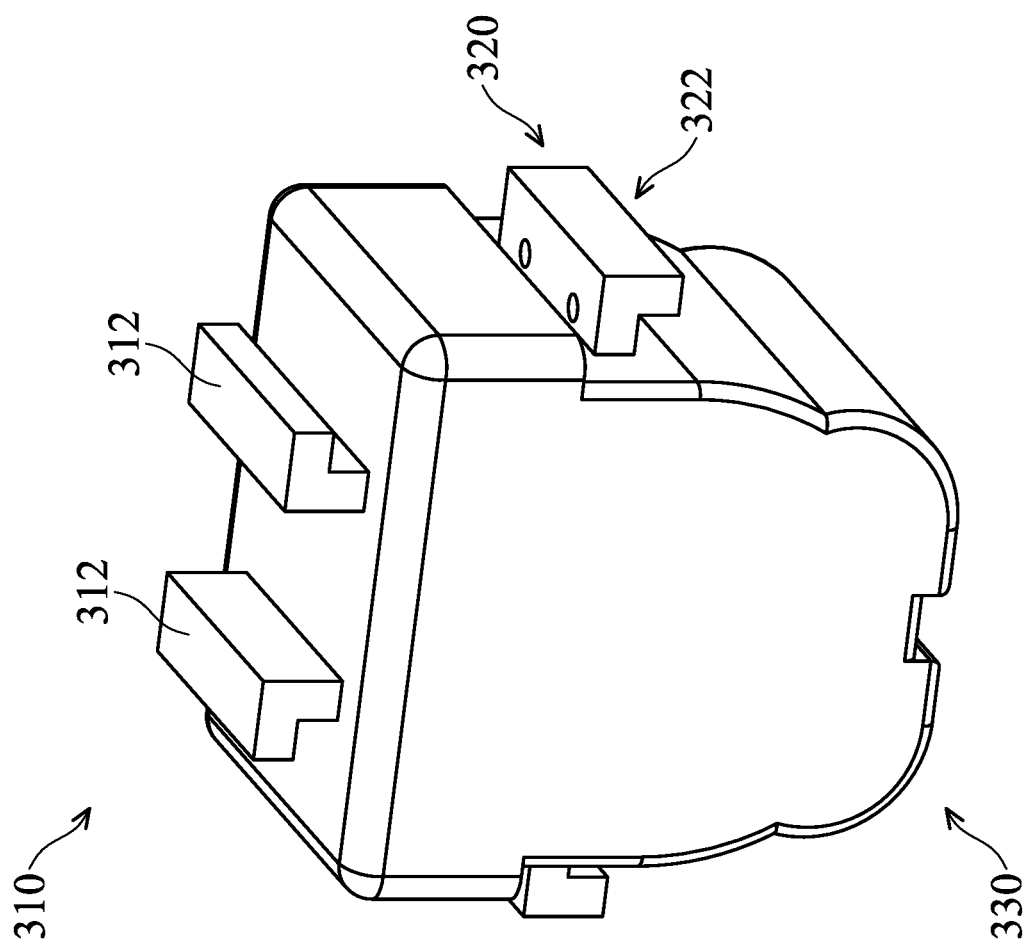
Figure 3B:
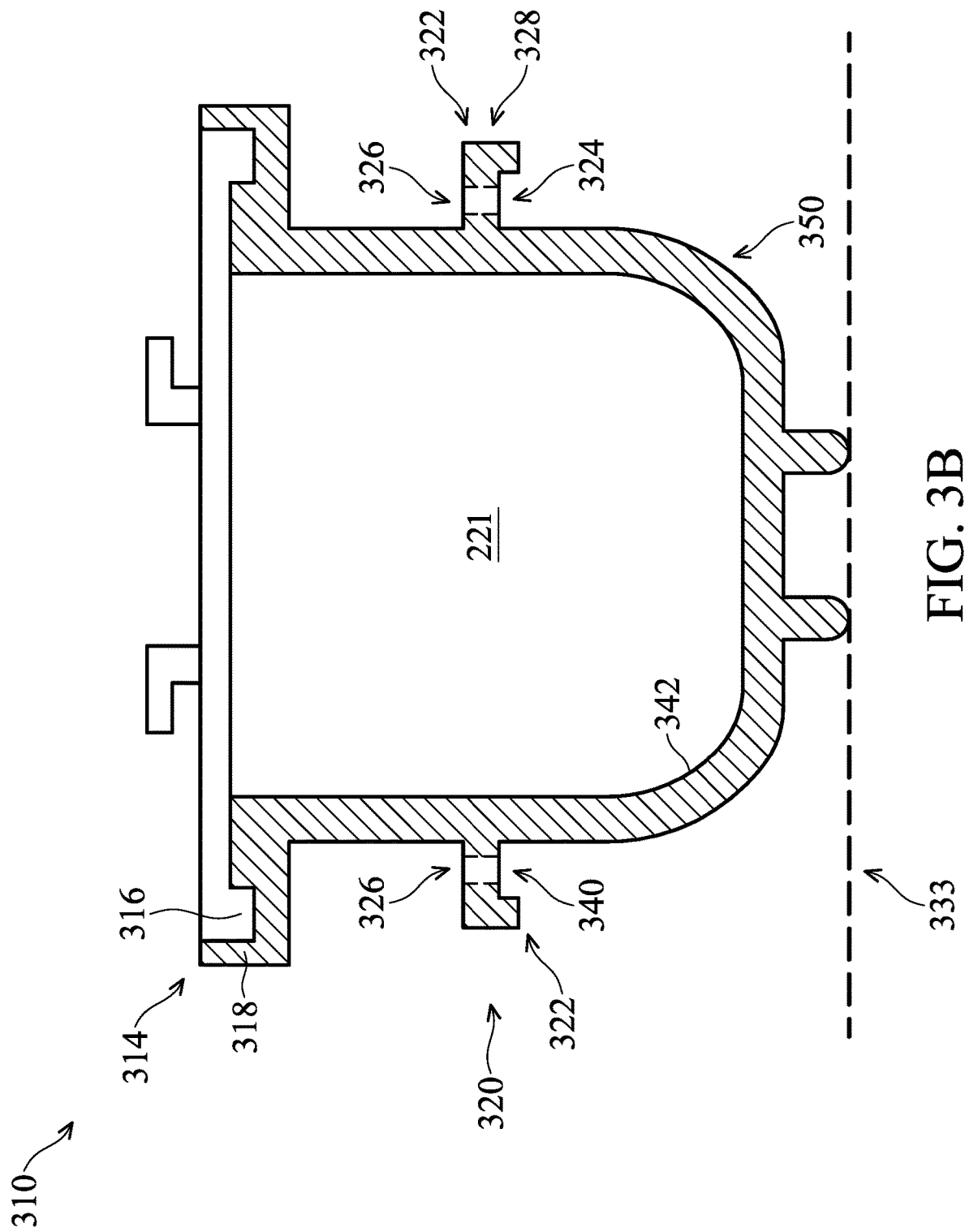

FIG. 3 shows a two-point perspective view of the space filling device 106 from top and side perspectives (FIG. 3A) and a side view of the space filing device 106 (FIG. 3B). Referring to FIG. 3, the space filling device 106 includes an upper portion 310, a sidewall portion 320 and a bottom portion 330. The space filling device 106 includes a cavity 221 delimited by the upper portion 310, the sidewall portion 320, and the bottom portion 330.

In an embodiment, the upper portion 310 may include one or more upper handles 312 structured to be engaged with the gripper of the object transfer robot 144 or to be gripped by an operator. The upper portion 310 may be detachable from the sidewall portion 320 and may be attached to the sidewall portion 320 through various engagement or locking mechanisms, which are all included in the disclosure. For example, as shown in FIG. 3B, a locking element 314 is structured to engage the upper portion 310 with the sidewall portion 320. The locking element 314 includes a locking lid 316 on the upper portion 310 and a groove portion 318 on the sidewall portion 320. The locking element 314 may also include various hinge elements and fastening element to effectuate the engaging between the locking lid 316 and the respective groove portion 318, which are omitted for simplicity purposes and for generalization purposes.

In another embodiment, the locking lid 316 may be structured to be part of the sidewall portion 320 and the groove portion may be structured to be part of the upper portion 310.

The sidewall portion 320 includes at least two side protrusion elements 322 that protrude outward from the sidewall portion 320. In an embodiment, the side protrusion elements 322 are bar-shaped and are disposed opposite to one another. Each of the bar-shaped side protrusion elements 322 is substantially in parallel with a bottom plane 333 that is the lowest plane of the bottom portion 330.

The side protrusion elements 322 may function as a handle for the gripper 148 of the object transfer robot 144 to hold the space filling device 106 with. To this extent, the side protrusion element 322 is configured to match the gripper 148 of the object transfer robot 144. For example, as shown in FIG. 3C, the side protrusion element 322 may include a first locking feature 324 and a second locking feature 326. The first locking feature 324 is a " " shaped edge portion of the side protrusion element 322 that facilitate holding and/or lifting of the space filling device 106 by the gripper 148 of the object transfer robot 144. The second locking feature 326 is a recess or a hole on a lower surface of the side protrusion element 322. The recess or the hole 326 is configured for a convex feature of the gripper 148 of the object transfer robot 144 to fit into. Other locking features are also possible with the side protrusion element 322 and are included in the disclosure.

Referring back to FIG. 3, the side protrusion element 322 may also function as a space saver between the sidewall portion 320 of the space filling device 106 and the sidewall 226 of the interior space 222 of the inner tank 120. To this extent, the side protrusion element 322 may have an overall convex edge surface 328 to minimize the contact to the sidewall 226 of the interior space 222.

Figure 4:
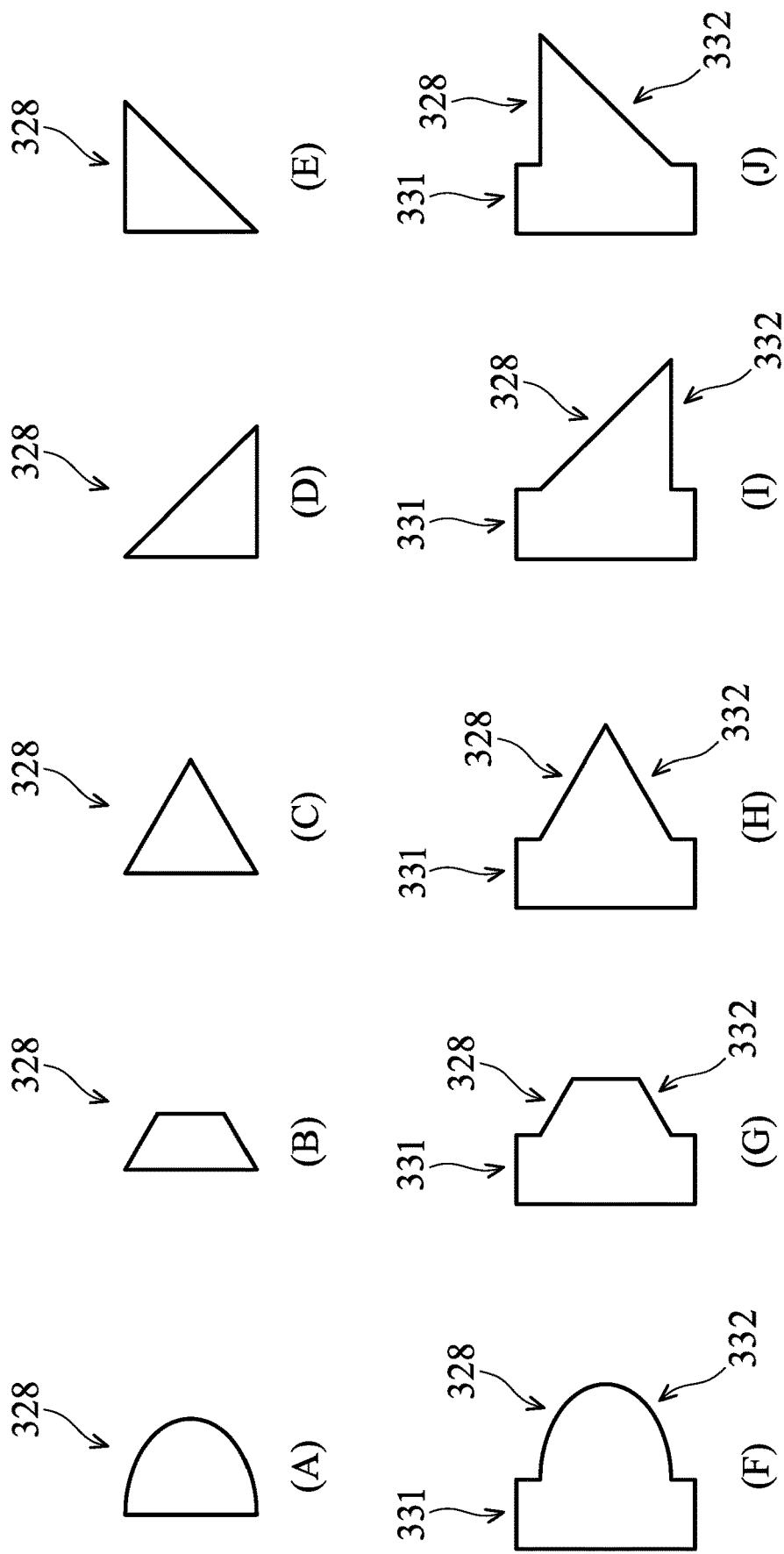
FIG. 4 shows surface shapes of a side protrusion element of the space filling device.

As shown in FIG. 4, in a cross-sectional view, the edge surface 328 may have a convex shape of a half sphere (FIG. 4A), a trapezoid (FIG. 4B), an isosceles triangle (FIG. 4C), a right triangle with hypotenuse side facing up (FIG. 4D), or a right triangle with hypotenuse side facing down (FIG. 4E). The edge surface 328 may also have an overall hat shape with a brim portion 331 behind the outermost convex portion 332. Specifically, the edge surface 328 may include a brim portion 331 and the outermost convex portion 332 of a half sphere (FIG. 4F), a trapezoid (FIG. 4G), an isosceles triangle (FIG. 4H), a right triangle with hypotenuse side facing up (FIG. 4I), or a right triangle with hypotenuse side facing down (FIG. 4J). Other shapes of the edge surface 328 that can reduce the contact area with the sidewall 226 of the interior space 222 are also possible and included in the disclosure.

In an embodiment, the side protrusion elements 322 are shaped and positioned similar to the handlers of the wafer cassette of the wafer transfer robot 142 that holds semiconductor wafers. As such, the space filling device 106 can be held or handled by the wafer transfer robot 142.

In an embodiment, the sidewall portion 320 of the space filling device 106 may include multiple side protrusion elements 322 that are arranged vertically with respect to one another. The multiple side protrusion elements 322 may be structured differently and configured to serve different functions from one another. For example, the first and second locking features 324, 326 may be included in one side protrusion element 322 and the convex edge surface 328 may be included in another side protrusion element 322.

Further, the side protrusion element 322 may also be similarly included on the upper portion 310.

Figure 5:
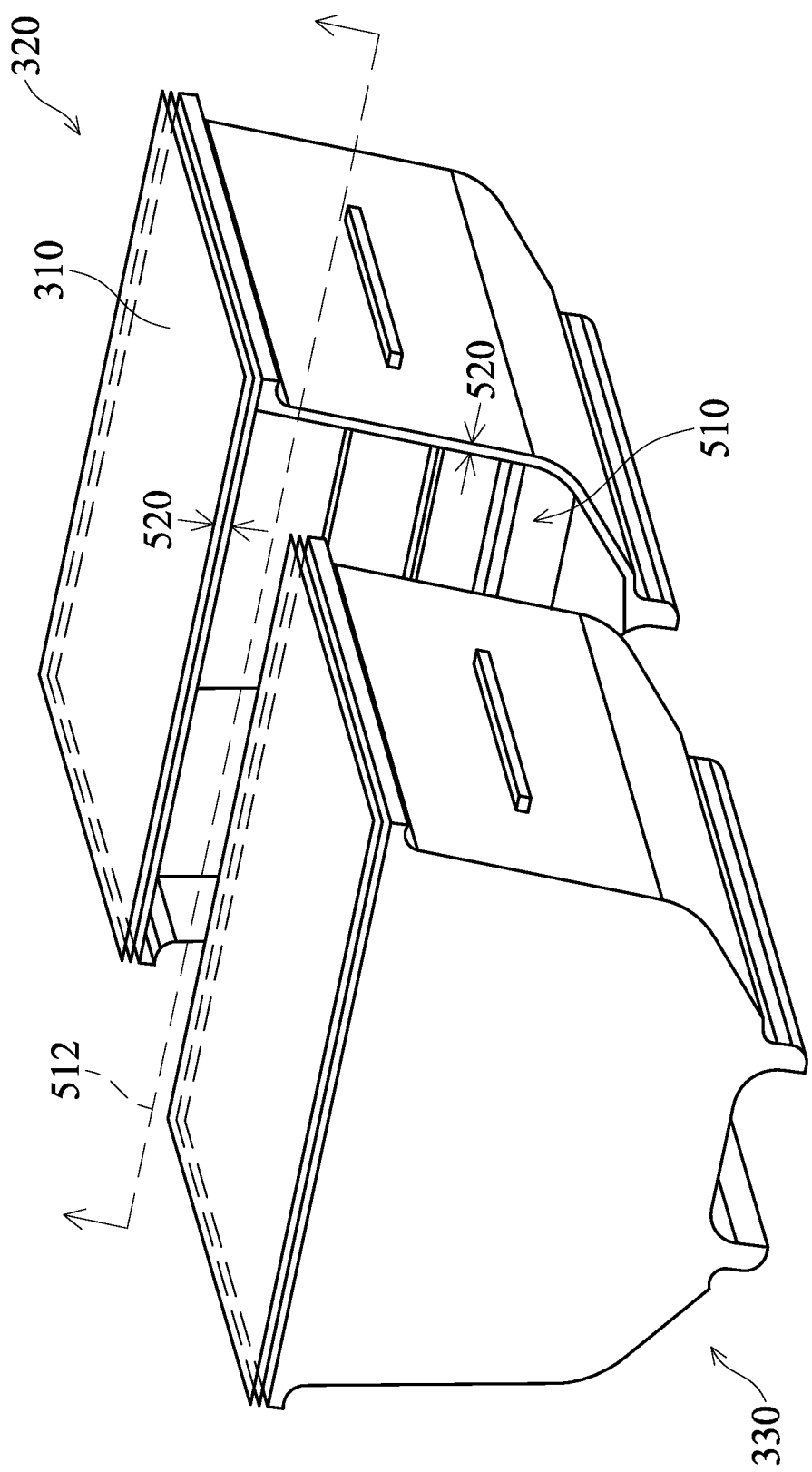
FIG. 5 shows an internal chamber of the space filling device.

In an embodiment, the space filling device 106 is a hollow device and includes an internal hollow chamber enclosed by the upper portion 310, the sidewall portion 320 and the bottom portion 330. FIG. 5 shows a perspective view of the space filling device 106 with a hollow chamber 510 revealed from a cross-sectional plane 512. The thickness 520 of one or more of the upper portion 310, the sidewall portion 320 or the bottom portion 330 is selected such that the upper portion 310, the sidewall portion 320 or the bottom portion 330 has the threshold structural solidity and the overall mass of the space filling device 106 is larger than a chemical solution contained in the inner tank 120 in a process of cleaning or purging the inner tank 120.

Figure 6A:
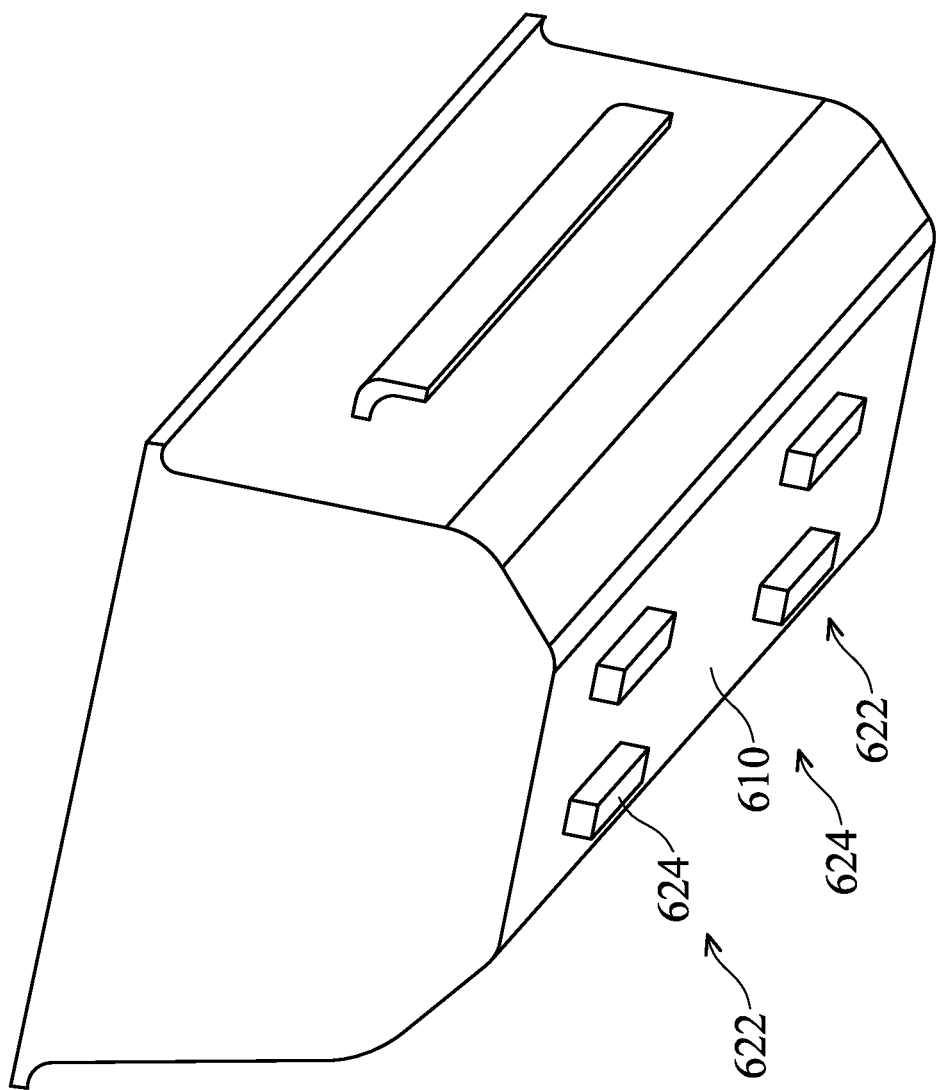
FIGS. 6A and 6B show other views of the space filling device.
Figure 6B:
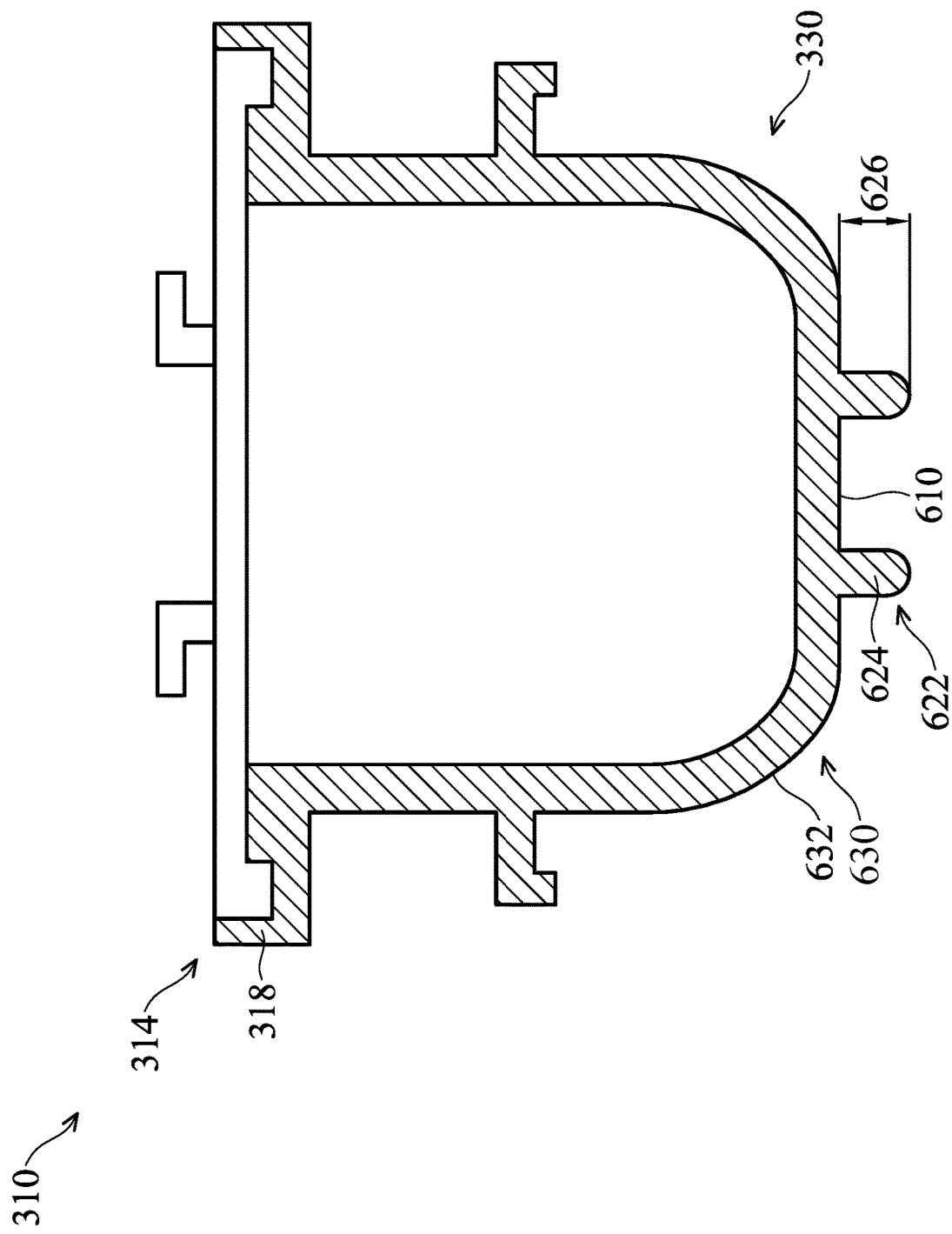
Figure 7:
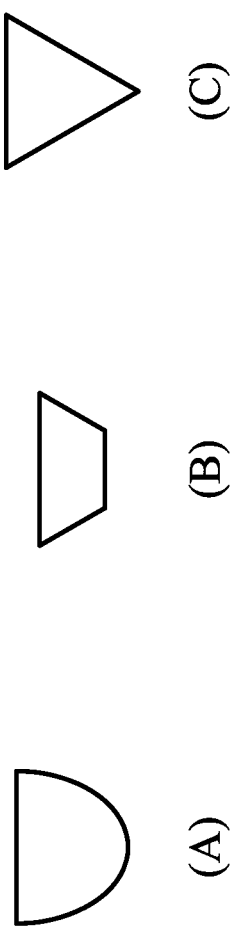
FIG. 7 shows surface shapes of a bottom protrusion element of the space filling device.

FIG. 6 shows a two-point perspective view of the space filling device 106 from bottom and side perspectives (FIG. 6A) and a side view of the space filing device 106 (FIG. 6B). A bottom reference plane 610 is formed by at least two, shown as four, bottom protrusion elements 622, designed to act as feet that support the space filling device 106 in an upright position when positioned within the inner tank 120. In an embodiment, a bottom surface 624 of the bottom protrusion elements 622 is convex to reduce the contact area with the bottom surface 228 of the interior space 222 of the inner tank 120. For example, as shown in FIG. 7, from a cross-sectional view, the bottom surface 624 of the bottom protrusion element 622 may include a shape of a hemisphere (FIG. 7A), a trapezoid (FIG. 7B), a triangle (FIG. 7C) or other suitable convex shapes.

Referring back to FIG. 6, the height 626 of the bottom protrusion elements 622 are selected to be sufficiently large to facilitate fluidic flow of the cleaning chemicals underneath the bottom portion 330 of the space filling device 106. In an embodiment, the height 626 of the bottom protrusion element 622 is within a range between about 4 cm to about 20 cm.

Referring to FIG. 3 and FIG. 6 together, in an embodiment, the space filling device 106 includes a curved/rounded smooth transition at the corners or edges where two or more surfaces meet. For example, the bottom protrusion element 622 forms a rounded concave inner edge transition 630 with adjacent lower surface 632 of the bottom portion 330. The side protrusion element 322 includes a rounded concave inner edge transition 340 with adjacent side surface 342 of the sidewall portion 320. The sidewall portion 320 forms a rounded convex outer edge transition 350 with the bottom portion 330. The rounded smooth transition at the corners and the edges of the space filling device 106 facilitates fluidic flow of the cleaning chemical around the space filling device 106 when the space filling device is placed into the inner tank 120.

A surface material of the space filling device 106 is selected based on the cleaning chemical in the inner tank 120. For example, for acid chemical SPM ($H_2O_2+H_2SO_4$), the space filling device 106 may include a surface material of quartz. For Hydrofluoric acid (HF) or buffered oxide etch (BOE), the space filling device 106 may include a surface material of polyether ether ketone (PEEK). For alkali chemicals like the etch residual remover chemicals EKC™ or ACT690™, the space filling device 106 may include a surface material of quartz. The space filling device 106 may also include other chemical resistive surface materials, which are also included in the disclosure.

Figure 8:
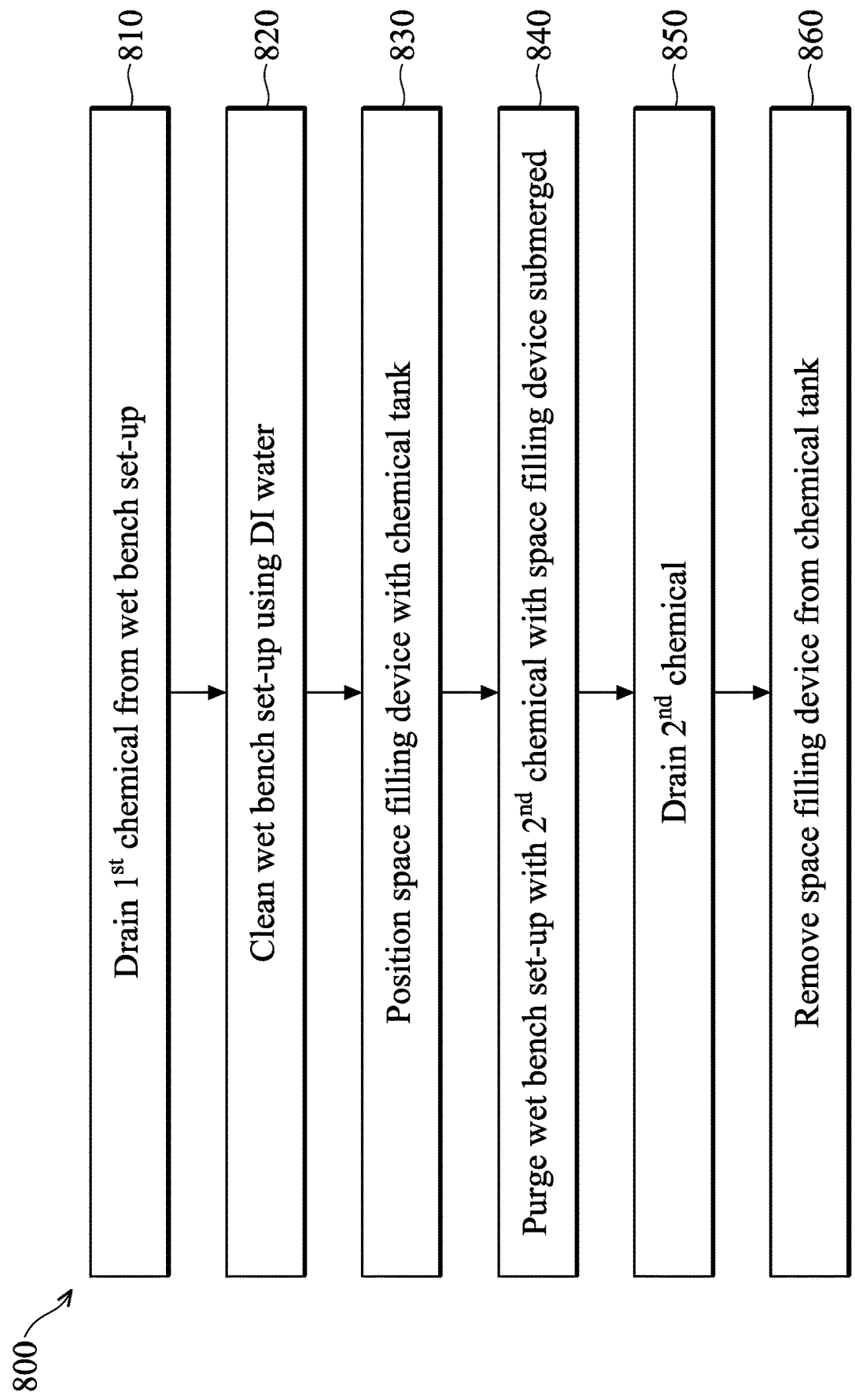
FIG. 8 shows an example process.
Figure 9:
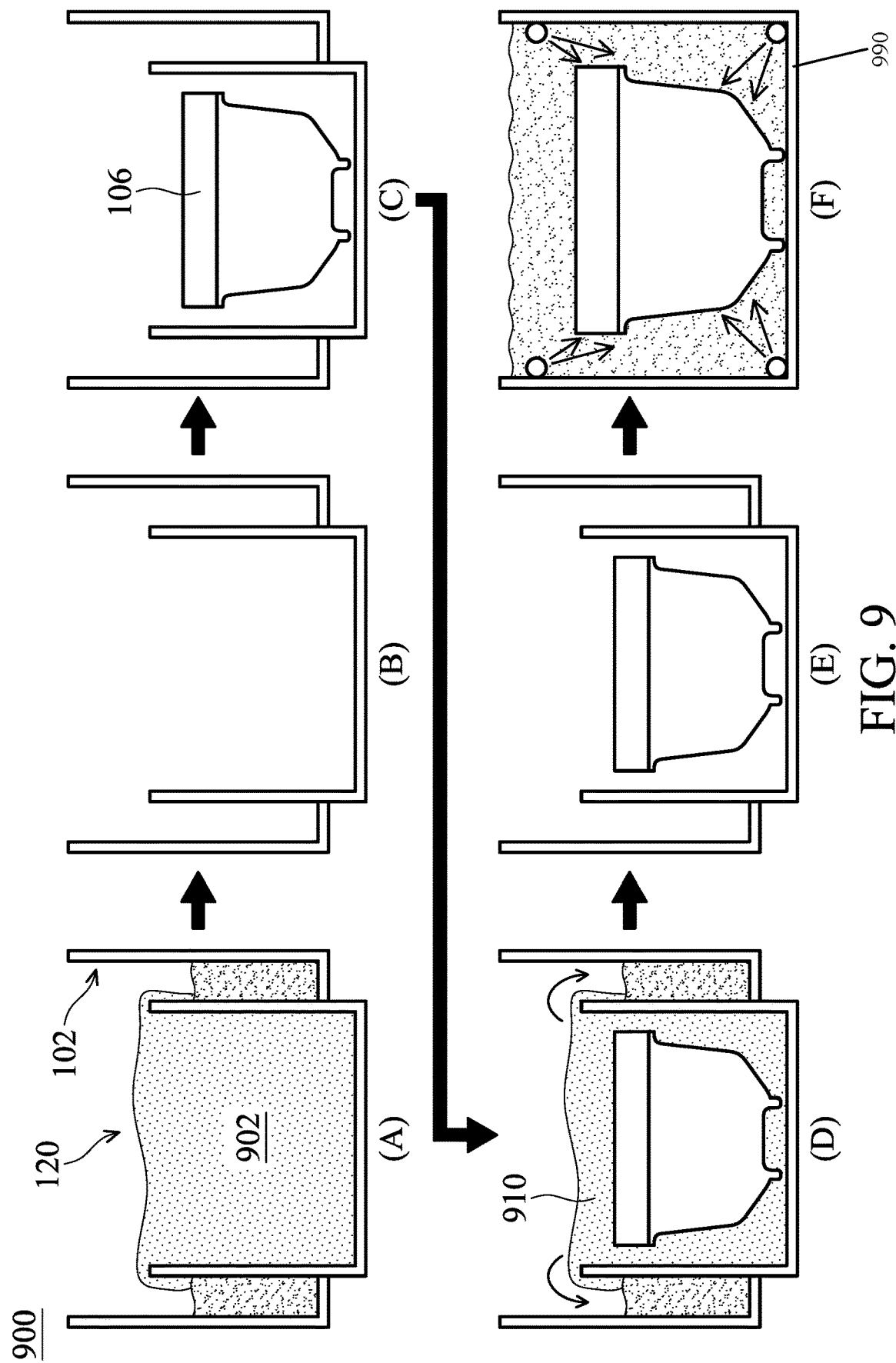
FIG. 9 shows an example application scenario of the process of FIG. 8.

FIG. 8 is a flow diagram of an example process 800. FIG. 9 shows an application scenario 900 of applying the example process 800. Referring to FIGS. 8 and 9 together, in example operation 810, with reference also to FIG. 9A, a first chemical solution 902, e.g., cleaning chemical, in the wet bench set-up 102 is drained through the chemical circulation components 130. For example, the first chemical solution has been used to clean a semiconductor wafer that is immersed in the first chemical 902. As such, the first chemical 902 now contains contaminant materials or particles foreign to the cleaning chemical. Under normal operation conditions, the chemicals in the wet-bench set-up 102 may be replaced regularly with a frequency between about weekly to about monthly.

In example operation 820, with reference also to FIG. 9B, the wet bench set-up 102 is cleaned using deionized water (DI Water). After the cleaning, some residual DI water may stay with the wet bench set-up 102. Such residual DI water may be removed from the wet bench set-up 102. Otherwise, the performance of the chemicals in the wet bench set-up 102 may be compromised.

In example operation 830, with reference also to FIG. 9C, the space filling device 106 is positioned in the inner tank 120. The exterior size of the space filling device 106 is selected based on the size of the interior space 222 of the inner tank 120. For example, for a typical 200 mm (8") wet bench set-up 102, the interior space 222 has a cuboid shape with a dimension of 366 mm×466 mm×386 mm. The inside volume is 65834 $cm^3$ or 65.8 L. A suitable space filling device 106 may have a surface volume size between about 30 L and about 35 L. The dimension of the space filling device 106 are selected such that when the space filling device 106 is positioned within the inner tank 120, there is a gap of about 2 cm to about 8 cm between the interior space 222 and the space filling device 106, except for the bottom protrusion element 622 or the side protrusion element 322 of the space filling device 106, which may contact the interior space 222 of the inner tank 120. Further, the surface material of the space filling device 106 is selected based on the cleaning chemical to be used to purge or bath the wet bench set-up 102.

In an embodiment, the space filling device 106 is seated on the bottom surface 228 of the interior space 222. That is, the bottom protrusion elements 622 touch the bottom surface 228. In another embodiment, the object transfer robot 144 holds and hangs the space filling device 106 within the interior space 222, without the space filling device 106 touching the bottom surface 228. When hung in the interior space 222, the side protrusion 322 of the space filling device 106 may contact the sidewall 226 of the interior space 222. As can be appreciated, the contact area between the space filling device 106 and the interior space 222 may be difficult to be cleaned by the cleaning chemical. In some embodiments, a combination of hanging the space filling device 106 and seating the space filling device 106 may be adopted in cleaning the wet bench set-up 102 within the space filling device 106 involved.

Moreover, the overall density of the space filling device 106 is higher than the cleaning chemical to be used to purge or bath the wet bench set-up 102. As a result, when the inner tank 120 is filled with a cleaning chemical 910, at least a portion of the space filling device 106 remains embedded/submerged within the interior space 222 of the inner tank 120 and does not float over the cleaning chemical. In an embodiment, the embedded portion of the space filing device 106 occupies more than half of the volume of the interior space 222. In an embodiment, the upper portion 310 of the space filling device 106 may be detached from the sidewall portion 320 thereof such that a weight or load item may be added into the hollow chamber 510 to increase the overall density of the space filling device 106. Such weight or load item may be used to control the first portion of the space filling device 106 submerged in the chemical solution 910. It should be appreciated that for different chemical solution 910 of different density, the space filling device 106 may submerge within the chemical solution 910 differently with a different volume occupied by the first portion that submerges within the chemical solution. FIG. 9D shows that the space filling device 106 is totally submerged within the chemical solution 910, which is an example embodiment and does not limit the scope of the disclosure.

In example operation 840, with reference also to FIG. 9D, the wet bench set-up 102 is purged with the cleaning chemical 910 with the space filling device remaining embedded within the interior space 222 of the inner tank 120. For example, the cleaning chemical may be input into and completely fill the inner tank 120 and the outer basin 110 and may be circulated through the chemical circulation components 130. With the space filling device 106 embedded within the inner tank 120, less cleaning chemical is used to fill the inner tank 120. It should be appreciated that the cleaning chemical is referred to as "cleaning" chemical because it is used to clean the wet bench set-up 102 to, e.g., remove the residual DI water. The cleaning chemical may be a same chemical solution as those used in the wet bench set-up 102 to process a wafer.

In example operation 850, with reference also to FIG. 9E, the cleaning chemical is drained from the wet bench set-up 102, e.g., through the chemical circulation components 130.

The operations 840, 850 may be repeated multiple times using the same cleaning chemical or different cleaning chemicals.

In example operation 860, with reference also to FIG. 9F, the space filling device 106 is removed from the inner tank 120 and is cleaned in cleaning tank 990. For example, quick-dump-rinses (QDRs) and the spin rinse dryer (SRD) may be used to clean the space filling device 106 in cleaning tank 990 after being used in the inner tank 120.

The example embodiments are provided for thorough understanding of the disclosure and are not meant to limit the scope of the disclosure. Variants from the provided examples are possible. For example, the space filling device 106 may have any external shape that facilitates filling volume space within the interior space 222 of the inner tank 120. Various handler features may be included on the space filling device 106 to facilitate the gripping, handling or transportation of the space filling device 106. Various chemical resistive materials may be used as the surface material of the space filling device 106. For example, Teflon or stainless steel can also be used as the surface material of the space filling device 106.

The disclosure may be further appreciated through the following embodiments.

In an embodiment, a system includes a container structured for containing a chemical solution and for receiving a semiconductor substrate, and a space filling device structured to be received by the container and at least partially submerged in the chemical solution.

In another embodiment, a system includes a wet bench set-up having a chemical tank. The chemical tank has an interior space to receive a wafer cassette holding a semiconductor wafer. The interior space has a first volume of space. A liquid chemical solution is contained in the chemical tank. The system also includes a volume object having a first portion submerged within the liquid chemical solution. The first portion occupies at least half of the first volume of space of the interior space.

In a method embodiment, a method, a semiconductor wafer is immersed in a first chemical solution contained in a tank. The first chemical solution is removed from the tank. The tank is cleaned with deionized water. After the tank is cleaned with the deionized water, a space filling device is positioned within the tank. The tank is then purged with a second chemical solution with the space filling device remaining within the tank.

What is claimed is:

1. A method, comprising:
immersing a semiconductor wafer in a first chemical solution contained in a tank;
removing the first chemical solution from the tank;
cleaning the tank with deionized water;
after the cleaning the tank with the deionized water, positioning a space filling device within the tank;
purging the tank using a second chemical solution with the space filling device remaining within the tank; and
during the purging the tank using the second chemical solution, excluding the second chemical solution from an interior volume of the space filling device.

2. The method of claim 1, wherein the positioning of the space filling device within the tank includes seating the space filling device on a bottom surface of the tank.

3. The method of claim 1, wherein positioning the space filling device within the tank includes hanging the space filling device over the bottom surface of the tank.

4. The method of claim 1, further comprising:
removing the second chemical solution from the tank;
after removing the second chemical solution from the tank, removing the space filling device from the tank; and
after removing the space filling device from the tank, cleaning the space filling device.

5. The method of claim 4, wherein cleaning the space filling device includes exposing an external surface of the space filling device to a cleaning solution.

6. The method of claim 5, wherein cleaning the space filling device includes positioning the space filing device in a cleaning tank.

7. The method of claim 6, wherein exposing the external surface of the space filling device to the cleaning solution further includes introducing the cleaning solution into the cleaning tank in which the space filling device is present.

8. The method of claim 4, wherein cleaning the space filling device includes utilizing at least one of a quick-dump-rinse (QDR) technique and a spin rinse dryer (SRD) technique.

9. A method, comprising:
cleaning an inner tank with deionized water;
after the cleaning the inner tank with the deionized water, positioning a space filling device on a bottom surface of the inner tank, the space filling device contacting the bottom surface of the inner tank; and
purging the inner tank using a chemical solution with the space filling device remaining within the inner tank.

10. The method of claim 9, wherein cleaning the inner tank with deionized water further includes introducing the deionized water into the inner tank and having excess of the deionized water overflow into an outer basin around the inner tank.

11. The method of claim 9, wherein purging the inner tank with the chemical solution with the space filling device remaining in the inner tank including introducing the chemical solution into the inner tank and having excess of the chemical solution overflowing into an outer basin around the inner tank.

12. The method of claim 9, further comprising, after purging the inner tank using the chemical solution, removing the chemical solution from the inner tank and removing the space filling device from the inner tank.

13. The method of claim 12, further comprising, after removing the chemical solution and the spacing filling device from the second inner tank, cleaning the space filling device.

14. The method of claim 13, wherein cleaning the space filling device further includes:
positioning the space filling device within a cleaning tank; and
introducing a cleaning solution into the cleaning tank cleaning an external surface of the space filling device.

15. The method of claim 9, wherein positioning the space filling device within the inner tank further includes mechanically engaging one or more side protrusions extending from a side of the space filling device with an end effector of a transfer robot.

16. A method, comprising:
positioning a semiconductor wafer cassette within a tank, the semiconductor wafer cassette containing a semiconductor wafer;
cleaning the semiconductor wafer in the semiconductor wafer cassette by introducing a first chemical solution into the tank exposing the semiconductor wafer to the first chemical solution;
after cleaning the semiconductor wafer, removing the first chemical solution from the tank and removing the semiconductor wafer cassette from the tank;
after removing the first chemical solution and the semiconductor wafer cassette from the tank, cleaning the tank by introducing a deionized water into the tank;
removing the deionized water from the tank;
after removing the deionized water from the tank, positioning a space filling device within the tank, the space filling device not including semiconductor wafers;
cleaning the tank by introducing a second chemical solution into the tank in which the space filling device is present; and
after cleaning the tank by introducing the second chemical solution into the tank in which the space filling device is present, removing the second chemical solution from the tank and removing the space filling device from the tank.

17. The method of claim 16, wherein removing the first chemical solution from the tank occurs before removing the semiconductor wafer cassette from the tank.

18. The method of claim 17, wherein removing the second chemical solution from the tank occurs before removing the space filling device from the tank.

19. The method of claim 16, further comprising, after removing the space filling device from the tank, cleaning the space filling device.

20. The method of claim 19, wherein cleaning the space filling device includes exposing an external surface of the space filling device to a cleaning solution.

* * * * *